United States Patent
Goodwin

(10) Patent No.: US 7,309,914 B2
(45) Date of Patent: Dec. 18, 2007

(54) INVERTED CSP STACKING SYSTEM AND METHOD

(75) Inventor: Paul Goodwin, Austin, TX (US)

(73) Assignee: Staktek Group L.P., Austin, TX (US)

( * ) Notice: Subject to any disclaimer, the term of this patent is extended or adjusted under 35 U.S.C. 154(b) by 4 days.

(21) Appl. No.: 11/039,615

(22) Filed: Jan. 20, 2005

(65) Prior Publication Data

US 2006/0157842 A1 Jul. 20, 2006

(51) Int. Cl.
*H01L 23/02* (2006.01)
*H01L 23/48* (2006.01)
*H01L 23/52* (2006.01)

(52) U.S. Cl. .................. 257/686; 257/777; 257/702; 257/E23.177

(58) Field of Classification Search ............. 257/686, 257/777, 780, 723, 702, E23.177
See application file for complete search history.

(56) References Cited

U.S. PATENT DOCUMENTS

| | | | |
|---|---|---|---|
| 3,411,122 A | 11/1968 | Schiller et al. | |
| 3,438,604 A | 4/1969 | Hyftin | |
| 3,654,394 A | 4/1972 | Gordon | |
| 3,727,064 A | 4/1973 | Bottini | |
| 3,746,934 A | 7/1973 | Stain | |
| 3,766,439 A | 10/1973 | Isaacson | |
| 3,772,776 A | 11/1973 | Weisenburger | |
| 3,983,547 A | 9/1976 | Almasi | |
| 4,079,511 A | 3/1978 | Grabbe | |
| 4,103,318 A | 7/1978 | Schwede | |
| 4,288,841 A | 9/1981 | Gogal | |
| 4,398,235 A | 8/1983 | Lutz et al. | |
| 4,406,508 A | 9/1983 | Sadigh-Behzadi | |
| 4,437,235 A | 3/1984 | McIver | |
| 4,513,368 A | 4/1985 | Houseman | |
| 4,587,596 A | 5/1986 | Bunnell | |
| 4,645,944 A | 2/1987 | Uya | |
| 4,696,525 A | 9/1987 | Coller et al. | |
| 4,712,129 A | 12/1987 | Orcutt | |

(Continued)

FOREIGN PATENT DOCUMENTS

DE 004215467 A1 11/1992

(Continued)

OTHER PUBLICATIONS

Flexible Printed Circuit Technology—A Versatile Interconnection Option. (Website 2 pages) Fjelstad, Joseph. Dec. 3, 2002.

(Continued)

*Primary Examiner*—Nitin Parekh
(74) *Attorney, Agent, or Firm*—Fish & Richardson P.C.; Ryan McCarthy

(57) ABSTRACT

Two or more integrated circuits are stacked into a high density circuit module. The lower IC is inverted. Electrical connection to the integrated circuits is made by module contacts on a flexible circuit extending along the lower portion of the module. In one embodiment, the flexible circuit provides a balanced electrical connection to two CSP integrated circuits. In another embodiment, the flexible circuit provides a balanced electrical connection to inter-flex contacts of additional flexible circuits on two submodules. The additional flexible circuits provide further balanced connections to CSP integrated circuits in each submodule.

14 Claims, 10 Drawing Sheets

U.S. PATENT DOCUMENTS

| | | |
|---|---|---|
| 4,722,691 A | 2/1988 | Gladd et al. |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow, 3rd et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,311,401 A | 5/1994 | Gates, Jr. et al. |
| 5,313,097 A | 5/1994 | Haj-Ali-Ahmadi et al. |
| 5,343,075 A | 8/1994 | Nishino |
| 5,347,428 A | 9/1994 | Carson et al. |
| 5,357,478 A | 10/1994 | Kikuda et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,394,010 A | 2/1995 | Tazawa et al. |
| 5,394,303 A | 2/1995 | Yamaji |
| 5,397,916 A | 3/1995 | Normington |
| 5,402,006 A | 3/1995 | O'Donley |
| 5,420,751 A | 5/1995 | Burns |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley, III et al. |
| 5,479,318 A | 12/1995 | Burns |
| 5,484,959 A | 1/1996 | Burns |
| 5,493,476 A | 2/1996 | Burns |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,541,812 A | 7/1996 | Burns |
| 5,543,664 A | 8/1996 | Burns |
| 5,561,591 A | 10/1996 | Burns |
| 5,566,051 A | 10/1996 | Burns |
| 5,572,065 A | 11/1996 | Burns |
| 5,588,205 A | 12/1996 | Roane |
| 5,592,364 A | 1/1997 | Roane |
| 5,594,275 A | 1/1997 | Kwon et al. |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A | 7/1998 | Nicewarner, Jr. et al. |
| 5,778,522 A | 7/1998 | Burns |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,828,125 A | 10/1998 | Burns |
| 5,835,988 A | 11/1998 | Ishii |
| 5,841,721 A | 11/1998 | Kwon et al. |
| 5,869,353 A | 2/1999 | Levy et al. |
| 5,895,970 A | 4/1999 | Miyoshi et al. |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |
| 5,926,369 A | 7/1999 | Ingraham et al. |
| 5,949,657 A | 9/1999 | Karabatsos |
| 5,953,215 A | 9/1999 | Karabatsos |
| 5,959,839 A | 9/1999 | Gates |
| 5,963,427 A | 10/1999 | Bolleson |
| 5,973,392 A * | 10/1999 | Senba et al. ................ 257/686 |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,014,316 A | 1/2000 | Eide |
| 6,025,642 A | 2/2000 | Burns |
| 6,028,352 A | 2/2000 | Eide |
| 6,028,365 A | 2/2000 | Akram et al. |
| 6,034,878 A | 3/2000 | Osaka et al. |
| 6,040,624 A | 3/2000 | Chambers et al. |
| 6,072,233 A | 6/2000 | Corisis et al. |
| 6,084,293 A | 7/2000 | Ohuchi |
| 6,084,294 A | 7/2000 | Tomita |
| 6,097,087 A | 8/2000 | Farnworth et al. |
| 6,121,676 A | 9/2000 | Solberg |

| | | | | | | |
|---|---|---|---|---|---|---|
| 6,153,928 A * | 11/2000 | Cho ............................. 257/686 | | 6,803,651 B1 | 10/2004 | Chiang |
| 6,157,541 A | 12/2000 | Hacke | | 6,812,567 B2 | 11/2004 | Kim et al. |
| 6,165,817 A | 12/2000 | Akram | | 6,833,984 B1 | 12/2004 | Belgacem |
| 6,172,874 B1 | 1/2001 | Bartilson | | 6,849,949 B1 | 2/2005 | Lyu et al. |
| 6,178,093 B1 | 1/2001 | Bhatt et al. | | 6,876,074 B2 | 4/2005 | Kim |
| 6,187,652 B1 | 2/2001 | Chou et al. | | 6,884,653 B2 | 4/2005 | Larson |
| 6,205,654 B1 | 3/2001 | Burns | | 6,891,729 B2 | 5/2005 | Ko et al. |
| 6,208,521 B1 | 3/2001 | Nakatsuka | | 6,908,792 B2 | 6/2005 | Bruce et al. |
| 6,222,737 B1 | 4/2001 | Ross | | 6,914,324 B2 | 7/2005 | Rapport et al. |
| 6,225,688 B1 | 5/2001 | Kim et al. | | 6,919,626 B2 | 7/2005 | Burns |
| 6,233,650 B1 | 5/2001 | Johnson et al. | | 2001/0006252 A1 | 7/2001 | Kim et al. |
| 6,234,820 B1 | 5/2001 | Perino et al. | | 2001/0013423 A1 | 8/2001 | Dalal et al. |
| 6,262,476 B1 | 7/2001 | Vidal | | 2001/0015487 A1 | 8/2001 | Forthun |
| 6,262,895 B1 | 7/2001 | Forthun | | 2001/0035572 A1 | 11/2001 | Isaak |
| 6,265,660 B1 | 7/2001 | Tandy | | 2001/0040793 A1 | 11/2001 | Inaba |
| 6,266,252 B1 | 7/2001 | Karabatsos | | 2002/0006032 A1 | 1/2002 | Karabatsos |
| 6,281,577 B1 | 8/2001 | Oppermann et al. | | 2002/0030995 A1 | 3/2002 | Shoji |
| 6,285,560 B1 | 9/2001 | Lyne | | 2002/0048849 A1 | 4/2002 | Isaak |
| 6,288,907 B1 | 9/2001 | Burns | | 2002/0076919 A1 | 6/2002 | Peters et al. |
| 6,300,679 B1 | 10/2001 | Mukerji et al. | | 2002/0101261 A1 | 8/2002 | Karabatsos |
| 6,303,981 B1 | 10/2001 | Moden | | 2002/0139577 A1 | 10/2002 | Miller |
| 6,310,392 B1 | 10/2001 | Burns | | 2002/0164838 A1 | 11/2002 | Moon et al. |
| 6,313,998 B1 | 11/2001 | Kledzik et al. | | 2002/0180022 A1 | 12/2002 | Emoto |
| 6,316,825 B1 | 11/2001 | Park et al. | | 2003/0016710 A1 | 1/2003 | Kamoto |
| 6,323,060 B1 | 11/2001 | Isaak | | 2003/0042590 A1 * | 3/2003 | Goller et al. ............... 257/686 |
| 6,329,708 B1 | 12/2001 | Komiyama | | 2003/0045025 A1 | 3/2003 | Coyte et al. |
| 6,336,262 B1 | 1/2002 | Dalal et al. | | 2003/0049886 A1 | 3/2003 | Salmon |
| 6,351,029 B1 | 2/2002 | Isaak | | 2003/0081392 A1 | 5/2003 | Cady et al. |
| 6,360,433 B1 | 3/2002 | Ross | | 2003/0107118 A1 | 6/2003 | Pflughaupt et al. |
| 6,368,896 B2 | 4/2002 | Farnworth et al. | | 2003/0109078 A1 | 6/2003 | Takahashi et al. |
| 6,376,769 B1 | 4/2002 | Chung | | 2003/0168725 A1 | 9/2003 | Warner et al. |
| 6,392,162 B1 | 5/2002 | Karabatsos | | 2004/0000708 A1 | 1/2004 | Rapport et al. |
| 6,410,857 B1 | 6/2002 | Gonya | | 2004/0021211 A1 | 2/2004 | Damberg |
| 6,426,240 B2 | 7/2002 | Isaak | | 2004/0031972 A1 | 2/2004 | Pflughaupt et al. |
| 6,426,549 B1 | 7/2002 | Isaak | | 2004/0045159 A1 | 3/2004 | DiStefano et al. |
| 6,426,560 B1 | 7/2002 | Kawamura et al. | | 2004/0065963 A1 | 4/2004 | Karnezos |
| 6,433,418 B1 | 8/2002 | Fujisawa et al. | | 2004/0075991 A1 | 4/2004 | Haba et al. |
| 6,444,490 B2 | 9/2002 | Bertin et al. | | 2004/0099938 A1 | 5/2004 | Kang et al. |
| 6,444,921 B1 | 9/2002 | Wang et al. | | 2004/0104470 A1 | 6/2004 | Bang et al. |
| 6,446,158 B1 | 9/2002 | Karabatsos | | 2004/0113253 A1 * | 6/2004 | Karnezos .................... 257/686 |
| 6,449,159 B1 | 9/2002 | Haba | | 2004/0115866 A1 | 6/2004 | Bang et al. |
| 6,452,826 B1 | 9/2002 | Kim et al. | | 2004/0150107 A1 | 8/2004 | Cha et al. |
| 6,462,412 B2 | 10/2002 | Kamei et al. | | 2004/0157352 A1 | 8/2004 | Beroz et al. |
| 6,465,877 B1 | 10/2002 | Farnworth et al. | | 2004/0203190 A1 | 10/2004 | Pflughaupt et al. |
| 6,465,893 B1 | 10/2002 | Khandros et al. | | 2004/0217461 A1 | 11/2004 | Damberg |
| 6,473,308 B2 | 10/2002 | Forthun | | 2004/0217471 A1 | 11/2004 | Haba |
| 6,486,544 B1 | 11/2002 | Hashimoto | | 2004/0238931 A1 | 12/2004 | Haba et al. |
| 6,489,178 B2 | 12/2002 | Coyle et al. | | 2004/0245617 A1 | 12/2004 | Damberg et al. |
| 6,489,687 B1 | 12/2002 | Hashimoto | | 2005/0018495 A1 | 1/2005 | Bhakta et al. |
| 6,492,718 B2 | 12/2002 | Ohmori | | 2005/0035440 A1 | 2/2005 | Mohammed |
| 6,509,639 B1 | 1/2003 | Lin | | 2005/0040508 A1 | 2/2005 | Lee |
| 6,514,793 B2 | 2/2003 | Isaak | | 2005/0133897 A1 | 6/2005 | Baek et al. |
| 6,528,870 B2 | 3/2003 | Fukatsu et al. | | | | |
| 6,552,910 B1 | 4/2003 | Moon et al. | | FOREIGN PATENT DOCUMENTS | | |
| 6,560,117 B2 | 5/2003 | Moon | | | | |
| 6,572,387 B2 | 6/2003 | Burns et al. | | DE 004214102 A1 | | 12/1992 |
| 6,576,992 B1 | 6/2003 | Cady et al. | | EP 0426-303 A2 | | 10/1990 |
| 6,588,095 B2 | 7/2003 | Pan | | EP 461-639 A | | 12/1991 |
| 6,590,282 B1 | 7/2003 | Wang et al. | | JP 359088863 A | | 5/1984 |
| 6,600,222 B1 | 7/2003 | Levardo | | JP 60-254762 A | | 12/1985 |
| 6,614,664 B2 | 9/2003 | Lee | | JP 3641047659 A | | 3/1986 |
| 6,620,651 B2 | 9/2003 | He et al. | | JP 62-230027 A | | 8/1987 |
| 6,627,984 B2 | 9/2003 | Bruce et al. | | JP 4-209562 A | | 7/1992 |
| 6,657,134 B2 | 12/2003 | Spielberger et al. | | JP 4-4368167 A | | 12/1992 |
| 6,660,561 B2 | 12/2003 | Forthun | | JP 50-29534 A | | 2/1993 |
| 6,677,670 B2 | 1/2004 | Kondo | | JP 63-153849 A | | 6/1998 |
| 6,683,377 B1 | 1/2004 | Shim et al. | | JP 2000/307029 A | | 11/2000 |
| 6,690,584 B2 | 2/2004 | Uzuka et al. | | JP 2001077294 A | | 3/2001 |
| 6,699,730 B2 | 3/2004 | Kim et al. | | JP 2001085592 A | | 3/2001 |
| 6,707,684 B1 | 3/2004 | Andric et al. | | JP 2001332683 A | | 11/2001 |
| 6,709,893 B2 | 3/2004 | Moden et al. | | JP 2003037246 A | | 2/2003 |
| 6,768,660 B2 | 7/2004 | Kong et al. | | JP 2003086761 A | | 3/2003 |
| 6,781,240 B2 | 8/2004 | Choi et al. | | JP 2003088760 A | | 3/2003 |

| | | | |
|---|---|---|---|
| JP | 2003/309247 A | 10/2003 | |
| JP | 2003309246 A | 10/2003 | |
| JP | 2003/347475 A | 12/2003 | |
| JP | 2003/347503 A | 12/2003 | |
| WO | WO 03/037053 A1 | 5/2003 | |

OTHER PUBLICATIONS

Chip Scale Pakaging and Redistribution, Paul A. Magill, Glenn A. Rinne, J. Daniel Mis, Wayne C. Machon, Joseph W. Baggs, Unitive Electronics Inc., 1997.

Dense-Pac Microsystems, 16 Megabit High Speed CMOS SRAM DPS1MX16MKn3, 1997.

Dense-Pac Microsystems, 256 Megabyte CMOS DRAM DP3ED32MS72RW5, 1997.

Dense-Pac Microsystems, Breaking Space Barriers, 3-D Technology 1993.

Dense-Pac Microsystems, DPS512X16A3, Ceramic 512K X 16 CMOS SRAM Module, (2000).

IBM Preliminary 168 Pin SDRAM Registered DIMM Functional Description & Timing Diagrams, 1998.

3D Interconnection for Ultra-Dense Multichip Modules, Christian VAL, Thomson-CSF DCS Computer Division, Thierry Lemoine, Thomson-CSF RCM Radar Countermeasures Division, 2000.

High Density Memory Packaging Technology High Speed Imaging Applications, Dean Frew, Texas Instruments Incorporated, 1990.

Vertically-Integrated Package, Alvin Weinberg, Pacesetter, Inc. and W. Kinzy Jones, Florida International University, 1990.

1992 Proceedings, 42nd Electronic Components & Technology Conference, May 18-20, 1992.

Research Disclosure, Organic Card Device Carrier, 31318, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

William R. Newberry, Design Techniques for Ball Grid Arrays, Xynetix Design Systems, Inc., Portland, Maine, Published on the Internet., 2001.

Tessera Technologies, Inc.—Semiconductor Intellectual Property, Chip Scale Packaging—Website pages (3), Published on Internet., 2001.

Tessera Introduces uZ ä Ball Stacked Memory Package for Computing and Portable Electronic Products, Oyce Smaragdis, Tessera Public Relations, Sandy Skees, MCA PR (www.tessera.com/news_events/press_coverage.cfm); 2 figures that purport to be directed to the uZ ä—Ball Stacked Memory Package, Published Jul. 17, 2002. San Jose, CA.

Ron Bauer, Intel. "Stacked-CSP Delivers Flexibility, Reliability, and Space-Saving Capabilities", Spring 2002, Published on the Internet.

Tessera uZ Ball Stack Package. 4 figures that purport to be directed to the uZ—Ball Stacked Memory, Published on the Internet., 2002.

Chip Scale Review Online—An Independent Journal Dedicated to the Advancement of Chip-Scale Electronics. (Website 9 pages) Fjelstad, Joseph, Pacific Consultants L.LC., Published Jan. 2001 on Internet.

Flexible Thinking: Examining the Flexible Circuits Tapes. (Website 2 pages) Fjelstad, Joseph., Published Apr. 20, 2000 on Internet.

Die Products: Ideal IC Packaging for Demanding Applications—Advanced packaging that's no bigger than the die itself brings together high performance and high reliability with small size and low cost (Website 3 pages with 2 figures) Larry Gilg and Chris Windsor. Dec. 23, 2002. Published on Internet.

* cited by examiner

| Upper Device | Vdd | /rdqs | Vss | 801 |
| | Vddq | /DQs | Vss | 802 |
| Upper Device | DQ6 | Vssq | rdqs | 801 |
| | DQ7 | Vssq | DQ5 | 802 |
| Upper Device | Vddq | DQ | Vddq | |
| | Vddq | DQ | Vddq | |
| Upper Device | DQ | Vssq | DQ | |
| | DQ | Vssq | DQ | |
| Upper Device | Vddq | Vref | Vss | |
| | Vdd | CK | Vssdl | |
| Upper Device | | CE | /WE | |
| | odt | /CK | /RAS | |
| Upper Device | BA2 | BA1 | BA0 | |
| | /CS1 | /CS0 | /CAS | |
| Upper Device | cke1 | A10 | A1 | |
| | Vdd | A0 | A2 | |
| Upper Device | Vss | A3 | A5 | |
| | | A4 | A6 | |
| Upper Device | | A7 | A9 | |
| | Vss | A8 | A11 | |
| Upper Device | Vdd | A12 | A14 | |
| | | A13 | A15 | |

| | | | |
|---|---|---|---|
| Vssq | /DQS | Vddq | 801 |
| Vss | rdqs | Vdd | 802 |
| rdqs | Vssq | DQ | 801 |
| DQ5 | Vssq | DQ | 802 |
| Vddq | DQ | Vddq | |
| Vddq | DQ | Vddq | |
| DQ | Vssq | DQ | |
| DQ | Vssq | DQ | |
| Vssdl | CK | Vdd | |
| Vss | Vref | Vdd | |
| /RAS | /CK | odt0 | |
| /WE | CE | | |
| /CAS | | /CS1 | |
| BA0 | BA1 | BA2 | |
| A2 | A0 | Vdd | |
| A1 | A10 | | |
| A6 | A4 | odt1 | |
| A5 | A3 | | |
| A11 | A8 | Vss | |
| A9 | A7 | | |
| A15 | A13 | | |
| A14 | A12 | Vdd | |

*FIG. 8*

INVERTED CSP STACKING SYSTEM AND METHOD

FIELD

The present invention relates to interconnects among electronic circuits, and especially to connection topologies for circuit modules.

BACKGROUND

A variety of techniques are used to interconnect packaged ICs into high density modules. Some techniques require special packages, while other techniques employ conventional packages. In some techniques, flexible conductors are used to selectively interconnect packaged integrated circuits. Staktek Group, L.P. has developed numerous systems for aggregating packaged ICs in both leaded and CSP (chip-scale) packages into space saving topologies.

A CSP package body typically has an array of BGA (ball grid array) contacts along a planar lower side that connect a packaged IC chip to an operating environment. The array of contacts allows a high density of connections between the CSP and an operating environment, such as, for example, a circuit board or stacked high-density circuit module.

One issue that may exist when memory CSPs are stacked is signal skew. Stacked memory CSPs typically share many signals such as address and data signals. It is beneficial for operational speed and simplicity if all common signal waveforms reach their destination simultaneously. Such simultaneous signaling may also help manage deleterious signal reflections that occur at the endpoints of signal traces. Many stacked memory modules, however, connect common signal contacts along a series of traces that carry a signal to one CSP after another, not simultaneously. Consequently, skewed signals arrive at different times at different CSPs in the same module.

Yet another issue related to connecting with circuit modules arises when ICs are arranged in stacked modules. Often the footprint of a circuit module is matched to the footprint of the bottom CSP in the module. Such a footprint may not have enough contacts for all desired input/output signal connections. This is especially true when the stacked module is a "system" module having a significant amount of signaling between ICs in the module. Further, a module may need to express a different contact footprint than the bottom CSP of the module to better meet the design needs of the system in which the module is used.

What is needed, therefore, are methods and structures for stacking circuits in thermally efficient, reliable structures that have adequate input and output connections with a flexible contact footprint capability. What is also needed are methods for interconnecting integrated circuits in a manner devised to create balanced signal interconnects and lumped impedance loads.

SUMMARY

Two or more integrated circuits are stacked into a high density circuit module. The lower IC is inverted. Electrical connection to the integrated circuits is made by module contacts on a flexible circuit extending along the lower portion of the module. In one embodiment, the flexible circuit provides a balanced electrical connection to two CSP integrated circuits. In another embodiment, the flexible circuit provides a balanced electrical connection to inter-flex contacts of additional flexible circuits on two submodules. The additional flexible circuits provide further balanced connections to CSP integrated circuits in each submodule. In some embodiments, form standards may be used to provide a reliable form about which to wrap flexible circuits.

BRIEF DESCRIPTION OF THE DRAWINGS

FIG. 8 shows a contact bailout pattern for a portion of a flex circuit according to one preferred embodiment of the present invention.

DETAILED DESCRIPTION OF PREFERRED EMBODIMENTS

Figure 1:
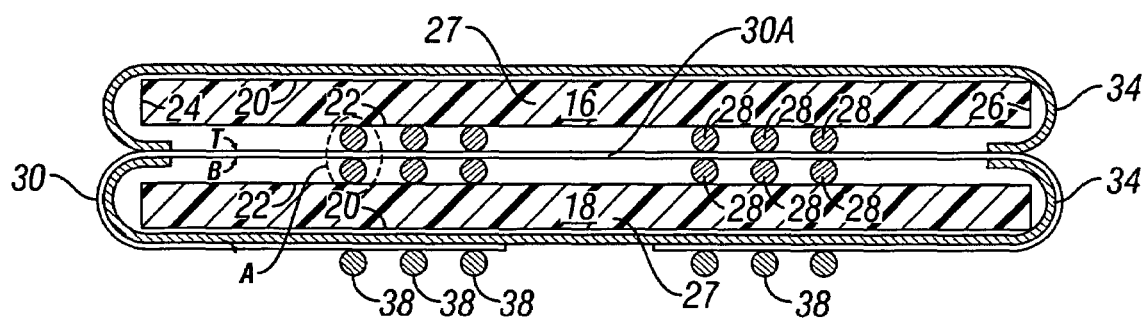
FIG. 1 is an elevation view of a module according to one preferred embodiment of the present invention.

FIG. 1 is an elevation view of module 10 devised in accordance with a preferred embodiment of the present invention. In this embodiment, module 10 includes upper CSP 16 and lower CSP 18. Lower CSP 18 is inverted with respect to upper CSP 16. Each of the constituent CSPs has an upper surface 20 and a lower surface 22 and opposite lateral edges 24 and 26 and includes at least one integrated circuit typically surrounded by a plastic body 27. The body need not be plastic, but a large majority of packages in CSP technologies are plastic. Those of skill will realize that the present invention may be devised to create modules with different size CSPs and that the constituent CSPs may be of different types within the same module 10. For example, one of the constituent CSPs may be a typical CSP having lateral edges 24 and 26 that have an appreciable height to present a "side" while other constituent CSPs of the same module 10 may be devised in packages that have lateral edges 24 and 26 that are more in the character of an edge rather than a side having appreciable height.

The invention is used with CSP packages of a variety of types and configurations such as, for example, those that are die-sized, as well those that are near chip-scale as well as the variety of ball grid array packages known in the art. It may also be used with those CSP-like packages that exhibit bare die connectives on one major surface. Thus, the term CSP should be broadly considered in the context of this application. Collectively, these will be known herein as chip scale packaged integrated circuits (CSPs) and preferred embodiments will be described in terms of CSPs, but the particular configurations used in the explanatory figures are not, however, to be construed as limiting. For example, the elevation view of FIG. 1 depicts a CSP of a particular profile known to those in the art, but it should be understood that the figures are exemplary only. The invention may be employed to advantage in the wide range of CSP configurations available in the art where an array of connective elements is available from at least one major surface. The invention is advantageously employed with CSPs that contain memory circuits, but may be employed to advantage with logic and computing circuits where added capacity without commensurate PWB or other board surface area consumption is desired.

Typical CSPs, such as, for example, ball-grid-array ("BGA"), micro-ball-grid array, and fine-pitch ball grid array ("FBGA") packages have an array of connective contacts embodied, for example, as leads, bumps, solder balls, or balls that extend from lower surface 22 of a plastic casing in any of several patterns and pitches. An external portion of the connective contacts is often finished with a ball of solder. Shown in FIG. 1 are contacts 28 along lower surfaces 22 of the illustrated constituent CSPs 16 and 18. Contacts 28 provide connection to the integrated circuit or circuits within the respective packages. In other embodiments, contacts 28 may be compressed prior to the complete construction of module 10.

Flex circuit 30 is shown connecting the constituent CSPs of the module of FIG. 1. Flexible circuit 30 has portion 30A disposed between the depicted CSPs. Portion 30A presents contacts along each side for connection to CSP 16 and inverted CSP 18. Such an inverted scheme allows electrical connection to each of the depicted CSPs with flex circuit 30 traces having a balanced, equal, or equivalent length. Such connections will be further described with reference to later Figures. Each of CSPs 16 and 18 has an associated form standard 34. Flex circuit 30 is, in this embodiment, wrapped about the lower form standard 34. While use of a form standard 34 is preferred, other embodiments may not use a form standard.

The entire flex circuit 30 may be flexible or, as those of skill in the art will recognize, a PCB structure made flexible in certain areas to allow conformability around CSPs and rigid in other areas for planarity along CSP surfaces may be employed as an alternative flex circuit in the present invention. For example, structures known as rigid-flex may be employed. More than one flex circuit may be employed to implement the connections between constituent CSPs in a module 10. Another exemplar embodiment uses three flexible circuits, but more or less may be used.

Each form standard 34 in FIG. 1 is disposed along upper planar surface 20 and laterally beyond edges 26 and 24 of body 27 of CSPs 16 and 18 in stacked module 10. Form standard 34 is disposed along a surface of a CSP even if literally separated from that surface by adhesive, for example.

Form standard 34 may take many configurations, with examples of embodiments having a downward opening form standard shown in pending U.S. patent application Ser. No. 10/453,398, filed Jun. 3, 2003, a flat form standard, an angular cap, and, as another exemplar, an upward opening form standard shown in pending U.S. patent application Ser. No. 10/845,029, filed May 13, 2004. Both of U.S. patent application Ser. No. 10/453,398 and U.S. patent application Ser. No. 10/845,029 are commonly owned by the assignee of the present invention and are hereby incorporated by reference. Module 10 exhibits module contacts 38 through which module 10 connects to application environments in a preferred embodiment. Those of skill will recognize that module contacts 38 are not required to connect module 10 to an application environment and other connective strategies may be employed such as, for example, direct pad to pad connection schemes.

Form standard 34 is, in a preferred embodiment, devised from nickel-plated copper to create a mandrel that mitigates thermal accumulation while providing a standard sized form about which flex circuitry is disposed. Form standard 34 may take other shapes and forms that are coincident with the respective CSP body. It also need not be thermally enhancing although such attributes are preferable. The form standard 34 allows the invention to be employed with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32) may be devised and used with the form standard 34 method and/or systems disclosed herein to create stacked modules with CSPs having different-sized packages. This will allow the same flex circuitry design to be employed to create iterations of a stacked module 10 from constituent CSPs having a first arbitrary dimension X across attribute Y (where Y may be, for example, package width), as well as modules 10 from, constituent CSPs having a second arbitrary dimension X prime across that same attribute Y. Thus, CSPs of different sizes may be stacked into modules 10 with the same set of connective structures (i.e. flex circuitry). Further, as those of skill will recognize, mixed sizes of CSPs may be implemented into the same module 10.

In a preferred embodiment, portions of flex circuits 30 and 32 may be attached to form standard 34 by metallic bonds. Preferred examples of such metallic bonding of flex circuitry to a form standard are further described in co-pending U.S. patent application Ser. No. 10/828,495, filed Apr. 20, 2004, which is commonly owned by the assignee of the present invention and hereby incorporated by reference. Other methods for attaching form standard 34 to flex circuitry may be employed in the present invention including, for example, a tape or liquid adhesive. If an adhesive is used for the attachment, the adhesive will be thermally conductive.

Form standard 34 associated with the upper depicted CSP 16 in this embodiment may improve the thermal performance of module 10. Other embodiments may not have a form standard associated with CSP 16.

Figure 2:
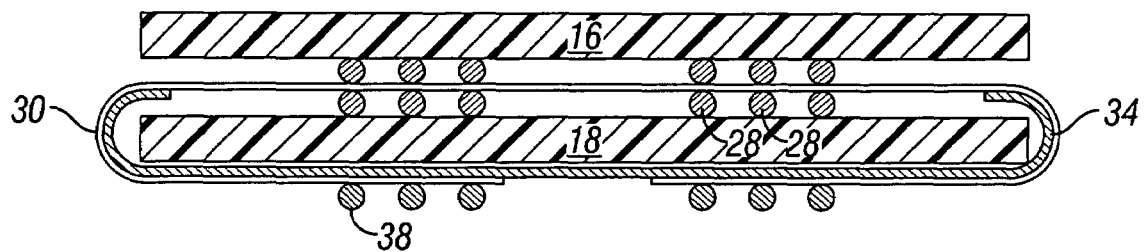
FIG. 2 depicts an embodiment without a second form standard according to another embodiment of the present invention.

FIG. 2 depicts an embodiment without a second form standard 34.

Figure 3:
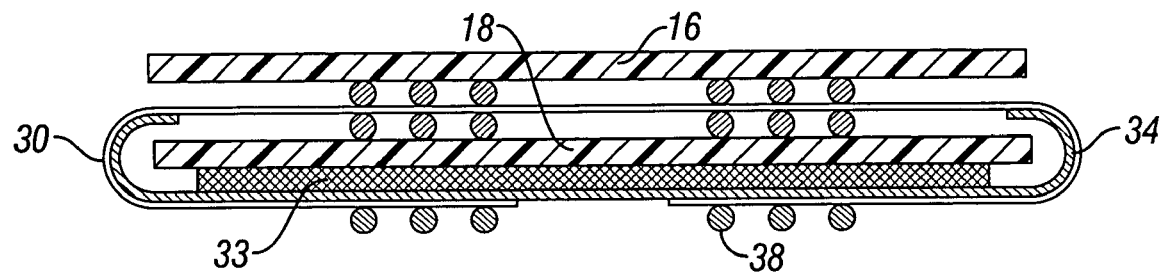
FIG. 3 depicts a two-level embodiment having a spacer according to another embodiment of the present invention.

FIG. 3 depicts a two-level embodiment having a spacer 33. The depicted spacer 33 may be employed to enable use of a standard-sized flex circuit 30 and form standard 34 with differently-sized CSPs 18. While FIG. 3 is not shown to scale, the depicted CSPs are thinner than those depicted in FIG. 1. Spacer 33 is preferably a piece of metal or other heat conductive material, and may also act as a heat spreader.

Figure 4:
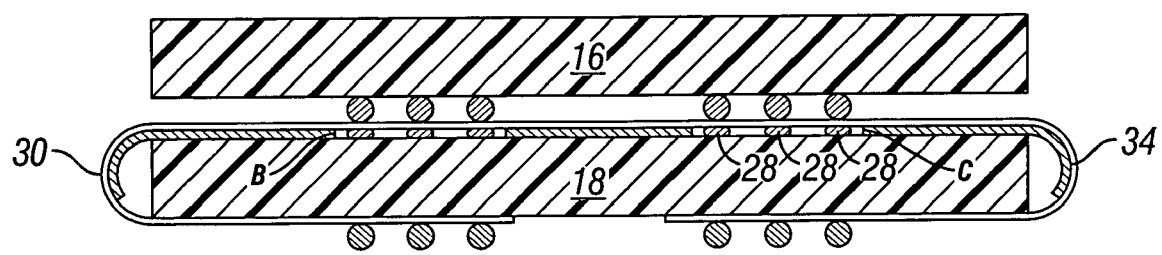
FIG. 4 depicts a two-level embodiment having an upward opening form standard associated with lower CSP according to another embodiment of the present invention.

FIG. 4 depicts a two-level embodiment of module 10 having standard 34 associated with lower CSP 18. Form standard 34 opens upward relative to CSP 18. The direction "upward" is meant to be with reference to the orientation of the depicted CSP 18 and as those of skill recognize, the side or major surface of CSP 18 having contacts 28 is typically referred to as "lower". Other embodiments may employ flat form standards that do not exhibit an opening orientation. Module 10 may be mounted in many different orientations. One preferred form standard 34 for use in embodiments such as that in FIG. 4 is the upward opening form standard shown in pending U.S. patent application Ser. No. 10/845,029, filed May 13, 2004, which application has been incorporated by reference. Form standard 34 as depicted in the embodiment of FIG. 4 is comprised of nickel-plated copper and exhibits two windows identified by references B and C to allow the array of contacts 28 that rise above lower surface 22 of the respective CSP to readily pass through form standard 34. Form standard 34 may take other configurations and may, for example, be devised in more than one piece.

Figure 5:
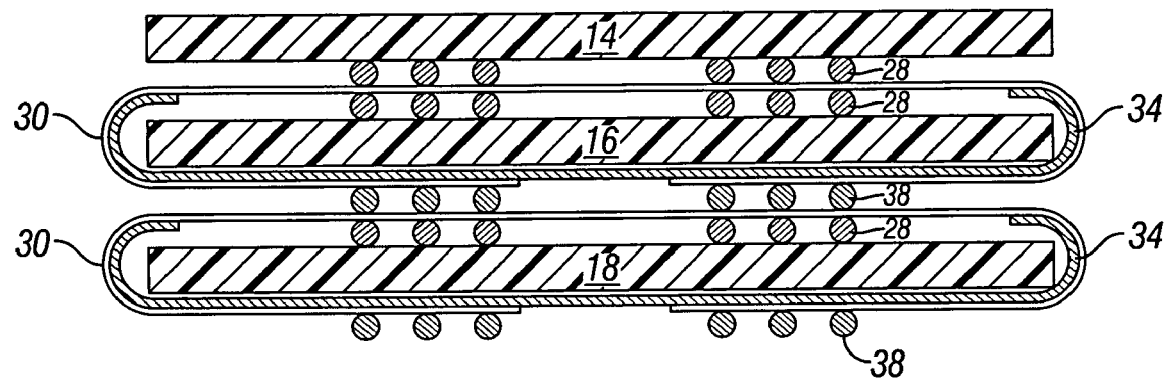
FIG. 5 depicts a three-level embodiment of a module having two inverted CSPs according to another embodiment of the present invention.

FIG. 5 depicts a three-level embodiment of module 10 having two inverted CSPs 16 and 18. The two depicted flex circuits 30 are disposed about respective form standards 34. The upper depicted CSP 14 is mounted to flex contacts along the upper depicted side of flex 30. In a preferred method of assembling the depicted module 10, the lower depicted CSPs 16 and 18 are first assembled into a submodule with their respective flex circuits 30, and submodule contacts 38 are added to the upper flex circuit 30. Submodule contacts 38 may be called "inter-flex" contacts 38 when they are employed as depicted between flex circuits 30. Such inter-flex contacts may be low-profile contacts having a flattened solder ball or other low profile contacts design such as, for example, a pad with built-up metal plating or solder.

Figure 6:
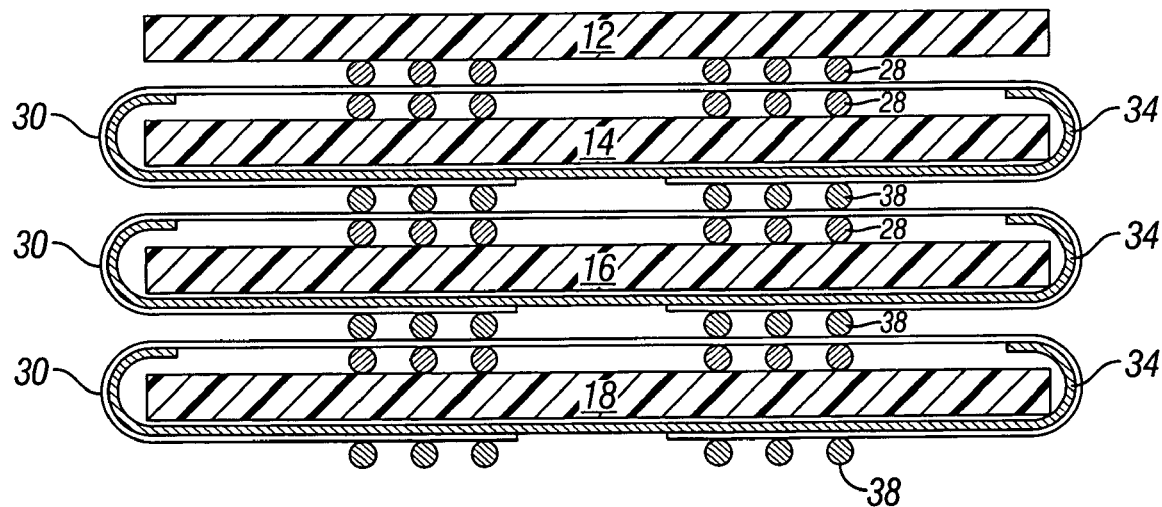
FIG. 6 depicts a four-level embodiment of a module according to another embodiment of the present invention.

FIG. 6 depicts a four-level embodiment of module 10 that employs three form standards 34 with a form standard 34 associated with each of CSPs 14, 16 and 18. Those of skill will recognize that each level in module 10 need not have a form standard but where maximum heat extraction is desired, use of a form standard 34 on the upper depicted CSP 12 is preferred. In this embodiment, inter-flex contacts 38 are used to enable connection between flex circuits 30 associated with CSPs 16 and 18, as well as between CSPs 14 and 16.

Figure 7:
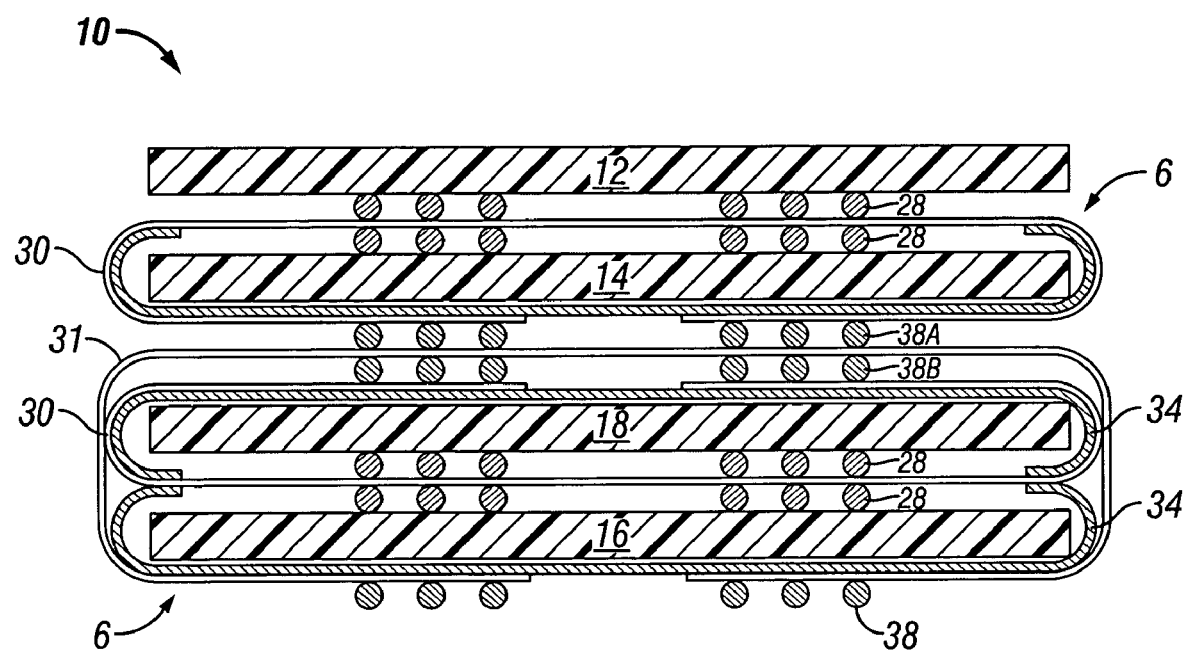
FIG. 7 depicts a four-level embodiment of module 10 that employs a submodule construction scheme according to another embodiment of the present invention.

FIG. 7 depicts a four-level embodiment of module 10 that employs a submodule construction scheme. In this embodiment, the lower depicted CSPs 18 and 16 are preferably constructed as a submodule 5 according to the embodiment in FIG. 1. The flex circuit 30 wrapped about form standard 34 associated with CSP 18 may be referred to as a "submodule" flex circuit, when used to connect a stacked submodule of CSPs that will be employed in a larger module. Such a submodule 5 is inverted in this embodiment, as shown by CSP 18 being depicted above CSP 16. An additional flex circuit 31 is depicted wrapped about submodule 5 to enable connection of submodule 5's submodule contacts 38A ("inter-flex contacts") to the operating environment through the lower depicted module contacts 38. The upper two CSPs 12 and 14 are also assembled into a submodule which is mounted with submodule contacts 38B ("inter-flex contacts") to flex contacts on flex circuit 31.

Such use of a flex circuit 31 may provide, in this embodiment, a balanced signaling capability by providing equal-length conductive paths to each of the depicted CSPs from the operating environment to which module contacts 38 are meant to connect. Such a balanced signaling scheme is further described with reference to FIGS. 8-11.

FIG. 8 shows a contact bailout pattern for a portion of a flex circuit according to one preferred embodiment of the present invention. The pattern is shown for flex contacts on a flex circuit portion between an inverted CSP and a non-inverted CSP, such as portion 30A depicted in FIG. 1. In FIG. 8, the table alternates to show rows of a bailout pattern on both sides of portion 30A. Rows 801 show the bailout pattern on the top side of portion 30A, to which CSP 16 is attached. Rows 802 show the bailout pattern for the bottom side of portion 30A, to which CSP 18 is attached in the preferred embodiment depicted in FIG. 1.

Those of skill will understand that the bailout pattern varies between differently-sized memory devices, for different memory standards, and certainly among other applications besides memory. The bailout pattern depicted is that for a common memory CSP bailout pattern defined by JEDEC for DDR2 DRAMs. Many other types of CSPs may be used. Many of the depicted signals, although given a specific topology in this preferred bailout pattern, may be swapped with another signal of the same type as is needed for different memory allocation schemes or other applications. For example, DQ0 could be used as DQ8 or A4 could be swapped with A7 to facilitate routing.

Figure 9:
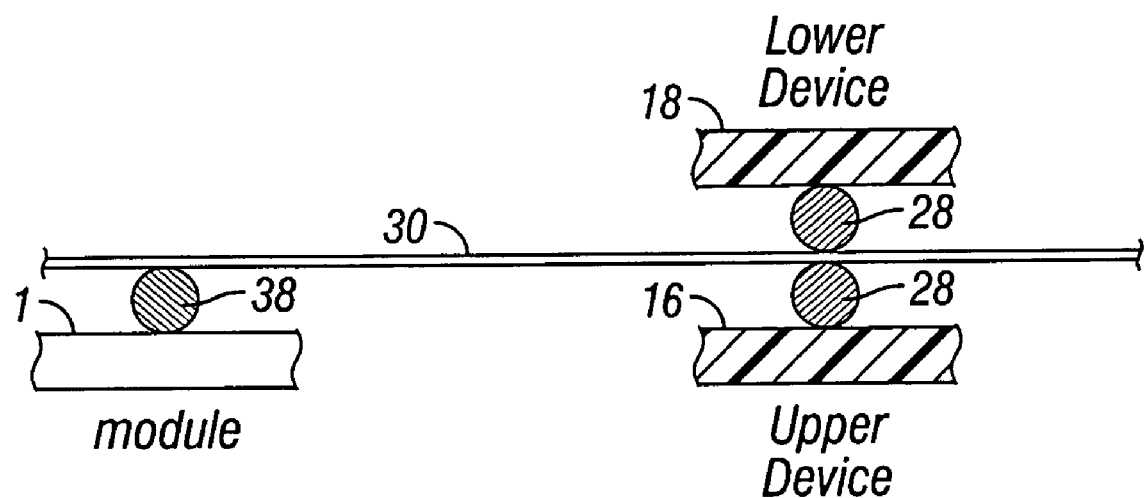
FIG. 9 depicts a connection topology for a flex circuit according to one embodiment of the present invention.

FIG. 9 depicts a connection topology for a flex circuit according to one embodiment of the present invention. In this depiction, flex circuit 30 is shown straightened to better illustrate the signal trace topology. A single module contact 38 is shown connected to an operating environment 1, which may be a memory DIMM board or other circuit board or system. Flex circuit 30 connects module contact 38 with a trace to contacts 28 on upper CSP 16 and lower CSP 18. In the depicted preferred topology, both contacts 28 are connected to the same flex contact pad or to oppositely-disposed and electrically connected contact pads on flex circuit 30. Such a connection allows signals such as address, data, and strobe signals to be routed to both of the depicted CSPs with the same signal delay. This balanced scheme may be desired for high-speed operations in which a minimal skew time between signals is critical. The depicted topology minimizes skew time by providing equal length traces, which may also provide more manageable signal reflections on the depicted signal line. Ball swapping is preferably employed to achieve such a balanced connections scheme wherever the bailout topology employed allows substitution of signals. Further, the depicted topology may present any transmission line terminations, such as, for example, on-die-terminations, which may be associated with each the depicted opposing contacts 28 as a lumped impedance to the transmission line (trace).

Figure 10:
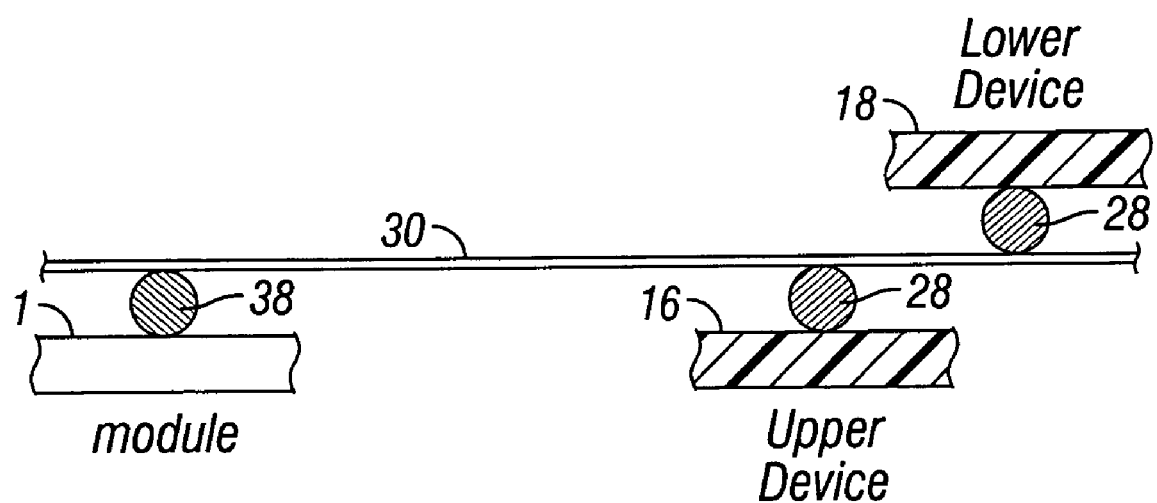
FIG. 10 depicts a connection topology for another embodiment.

FIG. 10 depicts a connection topology for another embodiment. In this embodiment, the depicted trace on flex 30 connects module contact 38 to a CSP contact 28 on upper CSP 16 and then to a contact 28 on CSP 18. Other connections may have a shorter connection to CSP 18. Such a connection scheme provides unequal length traces for the shared signal and is not preferred but may be employed, however, when the bailout topology of CSPs stacked in a particular module 10 requires it.

Figure 11:
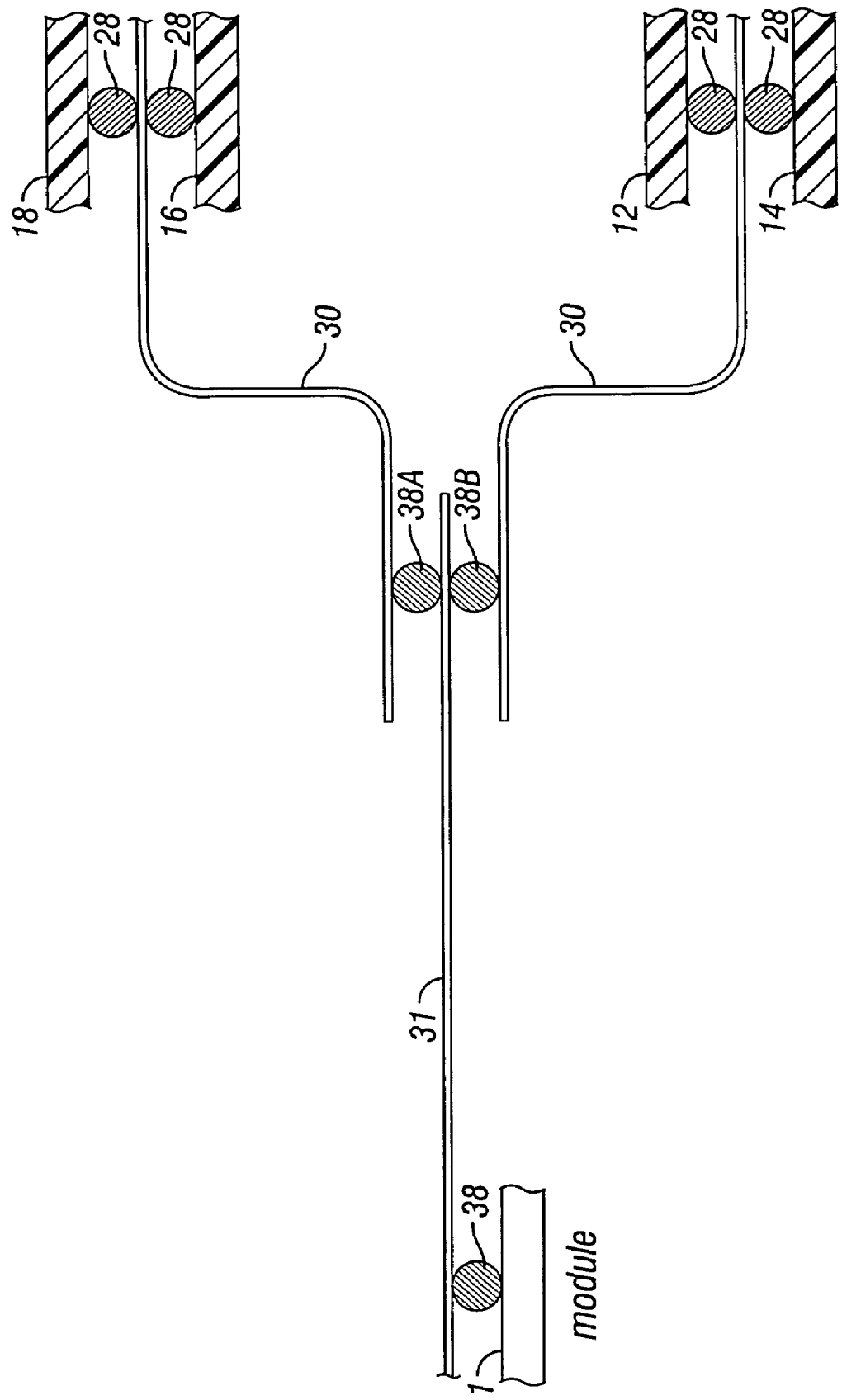
FIG. 11 depicts a connection topology for a four-level module according to one embodiment of the present invention.

FIG. 11 depicts a connection topology for a preferred four-level module according to one embodiment of the present invention such as is depicted in FIG. 7. Flex circuit 31 connects module contact 38 with a trace to inter-flex contacts 38A and 38B, which may be attached to a central flex contact pad or to oppositely-disposed but electrically connected flex contact pads. Contacts 38A and 38B connect to respective pairs of CSP contacts 28 through the depicted traces on flex circuit 30. Such a signal topology allows equal length signal traces to all four CSPs in the depicted module 10.

Figure 12:
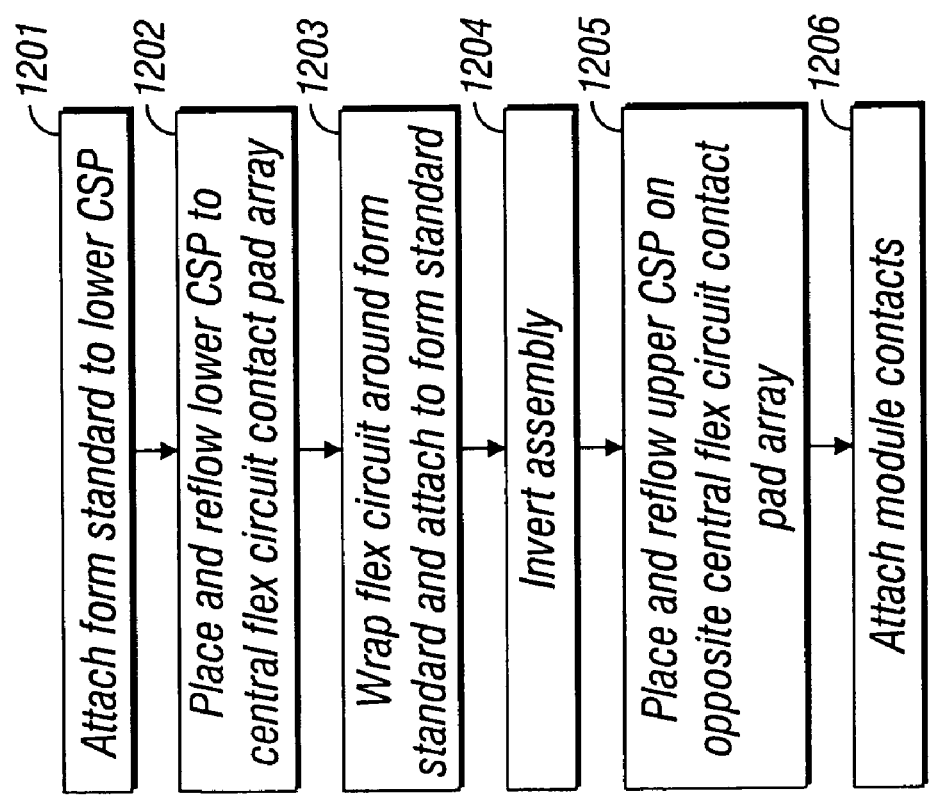
FIG. 12 is a flow chart of a process for making the embodiment depicted in FIG. 1.

FIG. 12 is a flow chart of a process for making a preferred embodiment such as that depicted in FIG. 1. Step 1201 attaches a form standard 34 to CSP 18. Such attachment is preferably made with heat conductive adhesive. Step 1202 places CSP 18 onto a flex contact pad array, preferably in the central portion 30A of flex 30. CSP 18 is preferably attached with standard solder reflow techniques. Step 1203 wraps flex circuit 30 around form standard 34 and attaches or tacks the loose end(s) of flex circuit 30 to form standard 34. The wrapping is preferably about the opposing curved "forms" depicted at both lateral sides of form standard 34 in FIG. 1. Other embodiments may, of course, use other shapes of form standard such as, for example, form standards that do not extend underneath the lateral sides of the associated CSP or flat form standards. The wrapping in step 1203 aligns flex contact pad arrays on each of the depicted wrapped ends for attachment of module contacts 38, which conform to a desired module footprint on the operating environment. The attachment in step 1203 is preferably done with adhesive or metallic bonds.

Step 1204 inverts the assembly to place portion 30A above CSP 18. This allows placement of CSP 16 on a flex contact array pad on the opposite side of flex circuit 30 from CSP 18 in step 1205. Step 1205 also reflows to attach CSP 16 to flex circuit 30. CSP 16 may optionally have a form standard 34 attached before step 1205. Step 1206 attaches module contacts 38 to a flex contact pad array.

Figure 13:
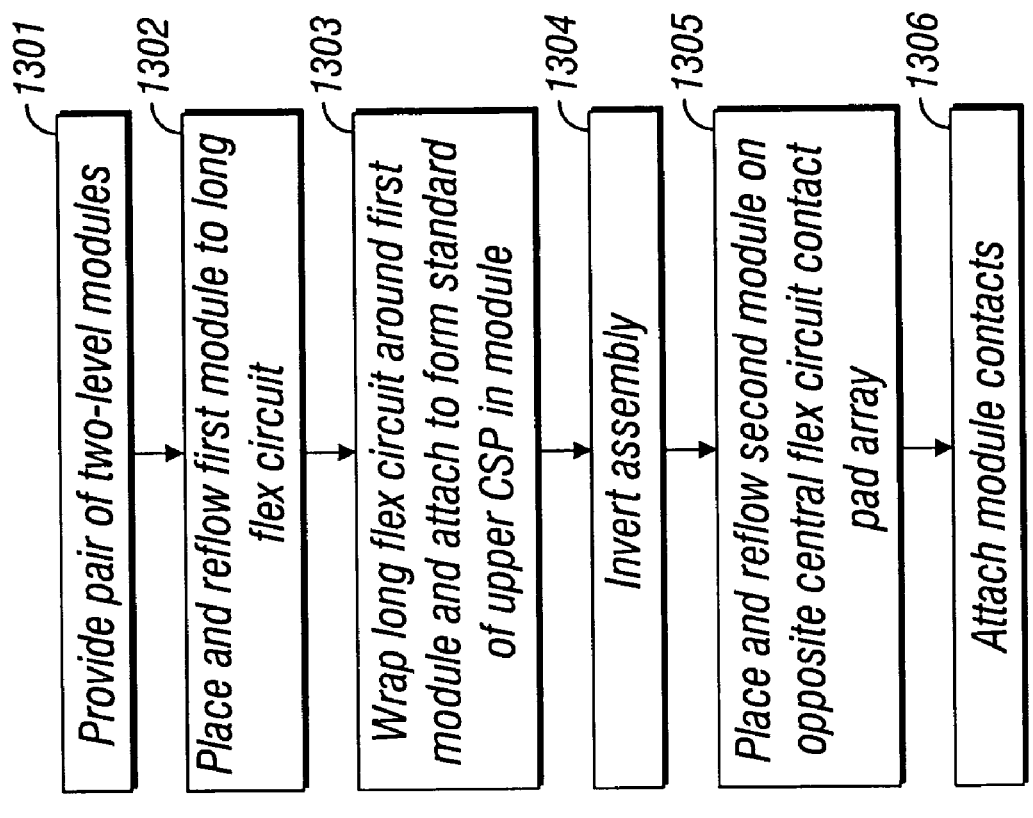
FIG. 13 is a flow chart of one process for making the embodiment depicted in FIG. 7.

FIG. 13 is a flow chart of one process for making a preferred embodiment such as that depicted in FIG. 7. In the process according to this embodiment, step 1301 first provides a pair of two-level modules such as those depicted in FIG. 1. The pair of modules are employed as submodules 5 and 6 for assembling the four-level module depicted in FIG. 7.

Step 1302 paces a first submodule 5 (FIG. 7) onto a long flex circuit 31 and reflows. Step 1303 wraps long flex circuit 31 around the first module and attaches the opposing ends to form standard 34 of CSP 16.

Step 1304 inverts the assembly for placement of the second submodule 6 on a contact pad array along the opposite side of flex circuit 31 from submodule 5. Step 1305 places and reflows the second submodule 6. Step 1306 attaches module contacts 38 to flex circuit 31.

Figure 14:
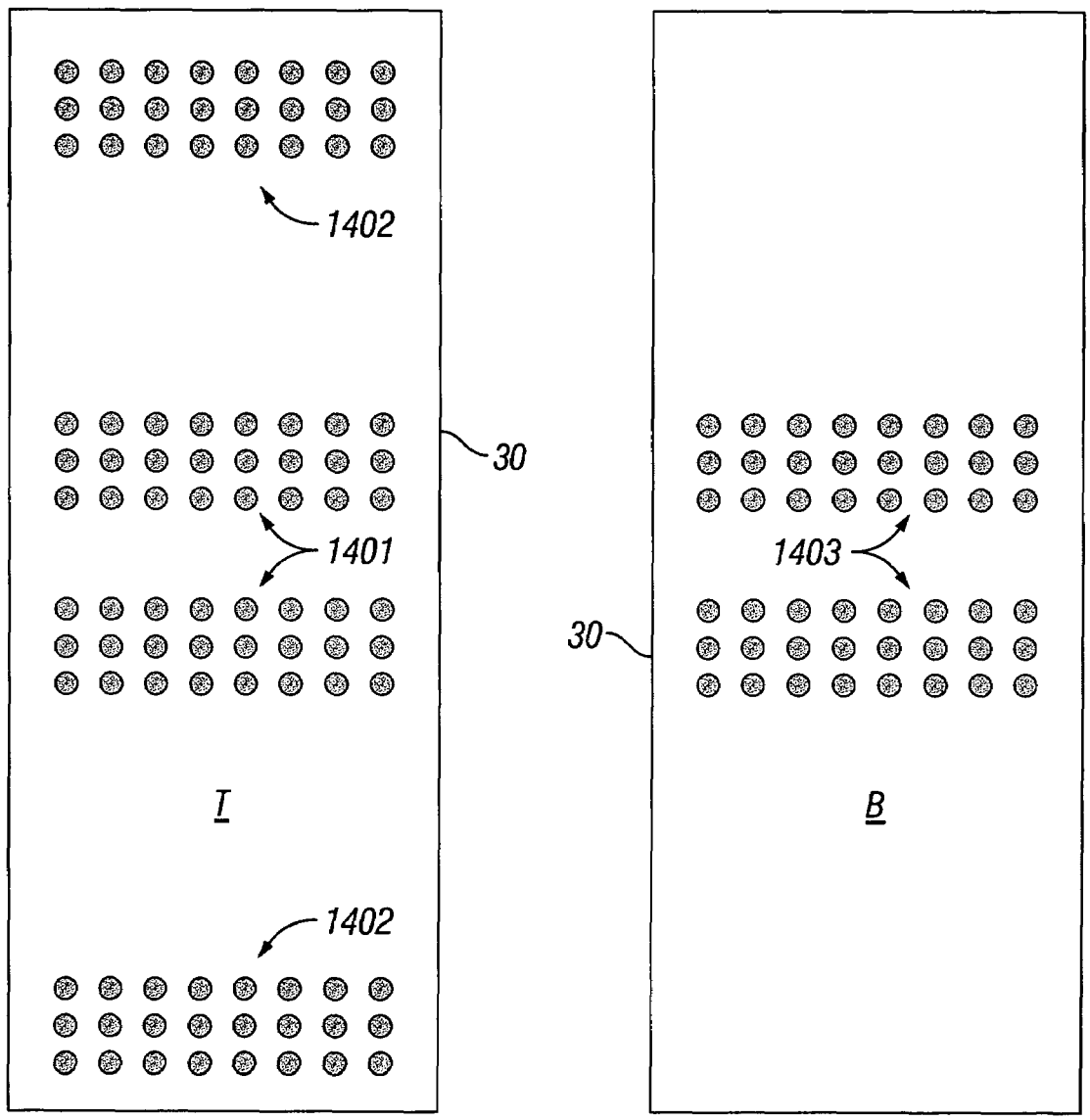
FIG. 14 depicts a top and bottom view of a flex circuit 30 according to the embodiment depicted in FIG. 1.

FIG. 14 depicts a top and bottom view of a flex circuit 30 according to the embodiment depicted in FIG. 1. Top side T is shown having flex contact pad array 1401 for attachment of attachment of CSP 16. Side T also has flex contact pad arrays 1402 for attachment of module contacts 38. Bottom side B has flex contact pad array 1403 for attachment of CSP 18. The depicted pad arrays are preferably expressed by conductive layers in flex circuit 30 and may be covered by insulative layers. Flex circuit 31 has a similar topology to that depicted here, but has length needed to wrap about a submodule of two CSPs.

Figure 15:
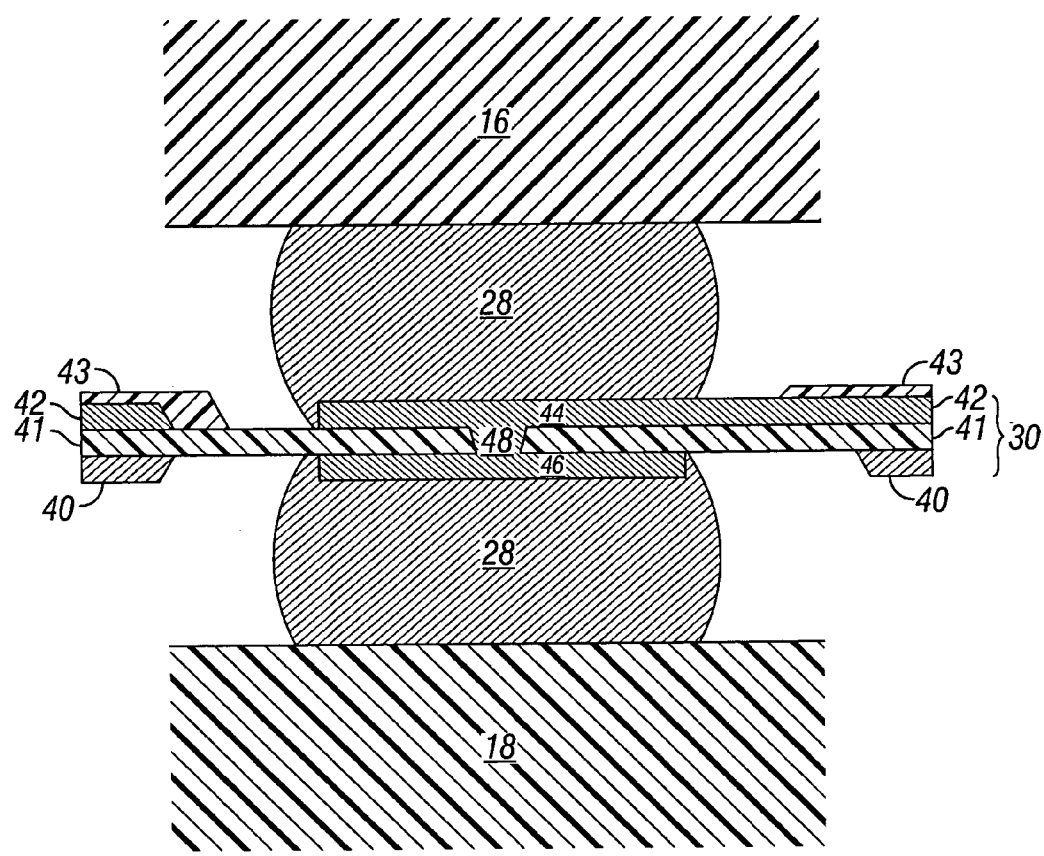
FIG. 15 is an enlarged cross-sectional view of the portion marked A in FIG. 1.

FIG. 15 is an enlarged cross-sectional view of the portion marked A in FIG. 1. In this embodiment, flex circuitry 30 comprises two conductive layers 40 and 42 separated by intermediate layer 41. Preferably, the conductive layers are metal such as alloy 110.

With continuing reference to FIG. 15, although optional outer layer 43 is shown over conductive layer 42, other additional or fewer layers may be included in flex circuitry employed in the invention. Flex circuits that employ only a single conductive layer such as, for example, those that employ only a layer such as conductive layer 42 may be readily employed in embodiments of the invention. The use of plural conductive layers may provide, however, advantages and the creation of a distributed capacitance across module 10 intended to reduce noise or bounce effects that can, particularly at higher frequencies, degrade signal integrity, as those of skill in the art will recognize.

In the depicted preferred embodiment, the opposing pair of flex contacts including flex contact 44 at the level of conductive layer 42 and flex contact 46 at the level of conductive layer 40 provide contact sites to allow interconnection of CSP contacts 28 through via 48. In this embodiment, flex contacts 44 are aggregated as the flex contact pad array 1401 depicted in FIG. 14. Flex contacts 46 preferably are aggregated as the array 1403. The depicted right-hand portion of conductive layer 42 expresses the conductive trace carrying the electrical signal to both contacts 28.

Other embodiments may not use a via but instead may connect opposing CSP contacts 28 (or module contacts 38 in the case of an embodiment such as that in FIG. 7) directly to a particular conductive layer through a window in flexible intermediate layer 41. Such connection is preferably with a direct connection with a very short length conductor. Such a short conductor presents both contacts as a lumped element with no transmission lines or traces between them. This may be beneficial for presenting both attached contacts 28 as a lumped circuit element or termination to the transmission line trace 44. Other embodiments may use a trace to connect flex contacts on opposite sides of flex 30 where the contacts conduct a common signal to CSP contacts 28 that are not directly opposite. Such a situation may be accomplished by using conductive traces 44 of equal or electrically equivalent length. Construction of traces having electrically equivalent length is known in the art. Further, while a two conductive layer flex circuit is shown, other embodiments may use other numbers of layers. Two conductive layers are preferred.

Figure 16:
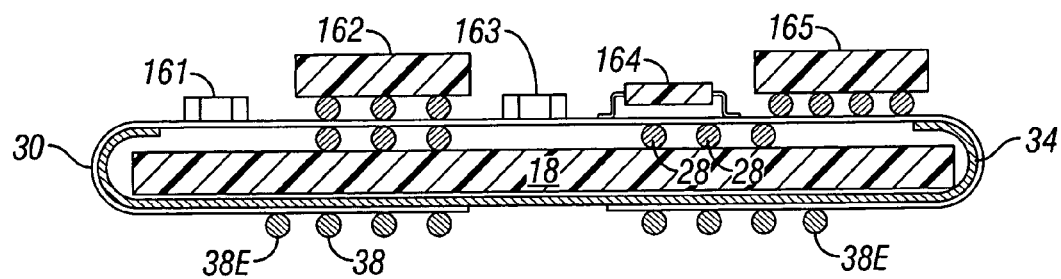
FIG. 16 depicts a circuit module according to an alternative embodiment of the present invention.

FIG. 16 depicts a circuit module according to an alternative embodiment of the present invention. In this embodiment, CSP 18 is inverted and connected to its operating environment though flex circuit 30. CSP 18 may also be interconnected to other components mounted to flex circuit 30. Extra module contacts 38E present additional connections which interconnect any of extra components 161-165 to an operating environment using the conductive traces of flex circuit 30. Other embodiments with multiple similarly sized CSPs such as, for example, multiple memory CSPs, may also have extra module contacts 38E. Such a scheme allows for expansion of circuit board mounting space. Such a scheme also allows for mounting of peripheral devices such as surface mount capacitor 161 and surface mount resistor 163 near their associated integrated circuits.

The depicted topology in FIG. 16 may be employed with a system arrangement where CSP 18 is a microprocessor or other controller and CSPs 162, 164, and 165 are supporting integrated circuits such as, for example, memory circuits, amplifiers, and analog-to-digital or digital-to-analog converters.

Although the present invention has been described in detail, it will be apparent to those skilled in the art that many embodiments taking a variety of specific forms and reflecting changes, substitutions and alterations can be made without departing from the spirit and scope of the invention. The described embodiments illustrate the scope of the claims but do not restrict the scope of the claims.

The invention claimed is:

1. A high density circuit module comprising:
   two or more CSPs arranged one above the other to form a stack, the stack having a selected bottom CSP, each of the two or more CSPs having a first major surface and a second major surface and a plurality of CSP contacts arranged along the first major surface;
   a form standard associated with the selected bottom CSP, the form standard comprising at least a selected lower portion disposed along the second major surface of the selected bottom CSP;
   one or more flexible circuits interconnecting the two or more CSPs, the one or more flexible circuits having a selected lower flexible circuit for connecting the module to an operating environment, a first portion of the selected lower flexible circuit being disposed along the selected lower portion of the form standard;
   a plurality of module contacts attached to the first portion of the selected lower flexible circuit;
   the selected bottom CSP being in an inverted disposition such that its second major surface is disposed lower than its first major surface.

2. The high density circuit module of claim 1 in which a second form standard is associated with a selected second CSP in the stack of CSPs.

3. The high density circuit module of claim 1 in which the stack comprises two CSPs and one flexible circuit, and in which the flexible circuit presents one or more balanced conductive traces connecting to selected one or more first ones of the CSP contacts, respectively, on the first CSP and connecting to a selected one or more second ones of the CSP contacts, respectively, on the second CSP.

4. A high density circuit module comprising:
   two or more CSPs arranged one above the other to form a stack, the stack having a selected bottom CSP, each of the two or more CSPs having a first major surface and a second major surface and a plurality of CSP contacts arranged along the first major surface;
   one or more flexible circuits interconnecting the two or more CSPs, the one or more flexible circuits having a selected lower flexible circuit for connecting the module to an operating environment, a first portion of the selected lower flexible circuit being disposed along the second major surface of the selected bottom CSP in the stack;
   a plurality of module contacts attached to the first portion of the selected lower flexible circuit;
   the selected bottom CSP being in an inverted disposition such that its second major surface is disposed lower than its first major surface.

5. The high density circuit module of claim 4 in which the stack comprises two CSPs and one or more flexible circuits, and in which the one or more flexible circuits present one or more balanced conductive traces connecting to selected one or more first ones of the CSP contacts, respectively, on the first CSP and connecting to a selected one or more second ones of the CSP contacts, respectively, on the second CSP.

6. The high density circuit module of claim 4 in which the one or more flexible circuits each comprise two conductive layers.

7. A circuit module including:
   a first CSP having first and second major surfaces and an array of contacts arranged along the first major surface;
   a first form standard affixed to the second major surface of the first CSP;
   a flexible circuit disposed about the form standard, the flexible circuit having a first side with a first set of flex contacts arranged along the first side, the first set of flex contacts connected to the array of contacts of the first CSP, the flexible circuit having a second side with a second set of flex contacts arranged along the second side, the second set of contacts being disposed opposite the first set of contacts, the flexible circuit having a third set of flex contacts and a fourth set of flex contacts;
   a second CSP mounted to the second set of flex contacts, the second CSP in an inverted, stacked disposition relative to the first CSP.

8. The circuit module of claim 7 further comprising a first group of module contacts connected to the third set of flex contacts, and a second group of module contacts connected to the fourth set of flex contacts.

9. The circuit module of claim 7 in which the flexible circuit comprises at least a first conductive layer and a second conductive layer.

10. The circuit module of claim 7 in which the second set of flex contacts are accessible through windows in an outer layer of the flexible circuit.

11. A high density memory module comprising:
   a first CSP and a second CSP each having first and second major sides and a plurality of CSP contacts arranged along the first major side, wherein one of the first CSP and the second CSP is a selected bottom CSP, which is in an inverted disposition such that its second major side is disposed lower than its first major side;
   a flexible circuit for connecting the first and second CSPs to an operating environment, the flexible circuit having a plurality of module contacts, a selected one or more of the module contacts being connected with a conductive trace to a selected one or more opposing pairs of flex contacts, each of the opposing pairs of flex contacts having connected to it at least one of the plurality of CSP contacts of the first CSP and at least one of the plurality of CSP contacts of the second CSP.

12. A circuit module comprising:
   two or more CSPs arranged in a stack one above the other, each of the two or more CSPs having a first major surface and a second major surface and a plurality of CSP contacts arranged along the first major surface, the stack having a selected bottom CSP, the selected bottom CSP being in an inverted, stacked disposition relative to another of the two or more CSPs;
   one or more flexible circuit interconnecting the two or more CSPs wherein at least one of the one or more flexible circuits presenting a first portion directly below the selected bottom CSP, the first portion having module contacts for connecting the circuit module to an operating environment.

13. The circuit module of claim 12 in which the flexible circuit comprises one or more opposing pairs of interconnected flex contacts connected to one or more conductive traces, respectively, the one or more conductive traces connected to respective ones of the module contacts.

14. The circuit module of claim 12 further comprising one or more form standards disposed about selected ones of the two or more CSPs.

* * * * *